(12) United States Patent
Kim et al.

(10) Patent No.: US 11,062,114 B2
(45) Date of Patent: Jul. 13, 2021

(54) DISPLAY DEVICE INCLUDING SENSOR

(71) Applicant: LG Display Co., Ltd., Seoul (KR)

(72) Inventors: JaeHyun Kim, Paju-si (KR); TaeHyoung Moon, Paju-si (KR); SungJin Lee, Paju-si (KR); DeukHo Yeon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/896,916

(22) Filed: Jun. 9, 2020

(65) Prior Publication Data

US 2020/0410194 A1 Dec. 31, 2020

(30) Foreign Application Priority Data

Jun. 25, 2019 (KR) .................. 10-2019-0075952

(51) Int. Cl.
*G06K 9/00* (2006.01)
*H01L 41/047* (2006.01)

(52) U.S. Cl.
CPC ....... *G06K 9/0002* (2013.01); *G06K 9/00067* (2013.01); *H01L 41/0471* (2013.01)

(58) Field of Classification Search
None
See application file for complete search history.

(56) References Cited

U.S. PATENT DOCUMENTS

| 2015/0036065 A1* | 2/2015 | Yousefpor | H04M 1/0266 349/12 |
| 2016/0163958 A1* | 6/2016 | Park | H01L 41/047 310/365 |
| 2019/0065805 A1* | 2/2019 | Zhao | G01S 7/52085 |
| 2019/0250752 A1* | 8/2019 | Shim | G06F 3/0414 |

\* cited by examiner

*Primary Examiner* — Nicholas J Lee
(74) *Attorney, Agent, or Firm* — Fenwick & West LLP

(57) ABSTRACT

A display device comprises a display panel and a sensor, wherein the sensor includes a first piezoelectric material layer, a second piezoelectric material layer disposed under the first piezoelectric material layer to overlap the first piezoelectric material layer, a first common electrode disposed on the first piezoelectric material layer; a first sensor pixel electrode disposed under the second piezoelectric material layer, and a first element layer disposed under the first sensor pixel electrode and connected with the first sensor pixel electrode.

19 Claims, 17 Drawing Sheets

DISPLAY DEVICE INCLUDING SENSOR

CROSS REFERENCE TO RELATED APPLICATION

This application claims priority from Republic of Korea Patent Application No. 10-2019-0075952, filed on Jun. 25, 2019, which is hereby incorporated by reference in its entirety.

BACKGROUND

Field

Embodiments of the disclosure relate to a display device with a sensor.

Description of Related Art

The growth of the intelligent society leads to increased demand for various types of display devices. Display devices include liquid crystal displays (LCDs), organic light emitting displays (OLEDs), and quantum dot light emitting displays (QLEDs).

Display devices have various applications, such as in smartphones, tablet PCs, laptop computers, monitors, TVs, or other diversities of electronics. With the recent development of mobile communication technology, there is surging use of electronic devices capable of running various apps, such as smartphones, tablet PCs, or laptop computers. An electronic device may pack various sensors for driving apps and drive apps using information sensed by the sensors.

In the industry of electronic devices, a narrow bezel gains popularity to secure a larger image display area. However, narrowing the bezel may be limited by placing sensors in the bezel area.

SUMMARY

Various embodiments of the disclosure may provide a display device including sensors for performing various sensing operations.

Various embodiments of the disclosure may also provide a sensor-equipped display device that may implement a narrow bezel.

According to various embodiments of the disclosure, a display device comprises a display panel and a sensor, wherein the sensor includes a first piezoelectric material layer, a second piezoelectric material layer disposed under the first piezoelectric material layer to overlap the first piezoelectric material layer, a first common electrode disposed on the first piezoelectric material layer; a first sensor pixel electrode disposed under the second piezoelectric material layer, and a first element layer disposed under the first sensor pixel electrode and connected with the first sensor pixel electrode.

According to various embodiments of the disclosure, there may be provided a display device including sensors for performing various sensing operations.

According to various embodiments of the disclosure, there may be provided a sensor-equipped display device that may implement a narrow bezel.

BRIEF DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION

Figure 1:
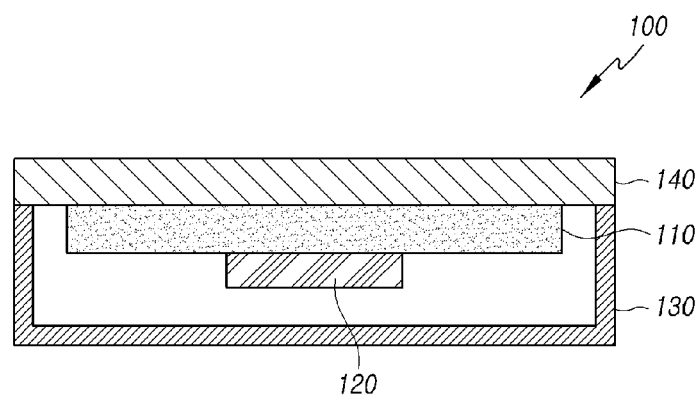
FIG. 1 is a cross-sectional view illustrating an example display device with a sensor according to various embodiments of the disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a cross-sectional view illustrating an example display device with a sensor according to various embodiments of the disclosure.

Referring to FIG. 1, a display device 100 may include a display panel 110 and a sensor 120 disposed on the back surface of the display panel 110. The display panel 110 and the sensor 120 may be disposed inside a housing 130 for protecting the display panel 110. A cover glass 140 may be disposed on the front surface of the display panel 110.

The display panel 110 may display images. When an object, e.g., the user's body portion (e.g., finger), is placed on the top of the display panel 110, the sensor 120 may detect the object. The sensor 120 may output a first ultrasonic wave signal in a low frequency band and a second ultrasonic wave signal in a high-frequency band so as to detect objects.

The sensor 120 may recognize an object, which is farther away from the sensor 120, using the first ultrasonic wave signal and an object, which is closer to the sensor 120, using the second ultrasonic wave signal. The sensor 120 may gather information regarding, e.g., the dermis or blood vessels of the body, using the first ultrasonic wave signal and information regarding, e.g., the epidermis of the body, such as fingerprints, using the second ultrasonic wave signal. The sensor 120 may include a first piezoelectric material for outputting the first ultrasonic wave signal and a second piezoelectric material for outputting the second ultrasonic wave signal. The first piezoelectric material may be positioned closer to the object than the second piezoelectric material is.

Figure 2:
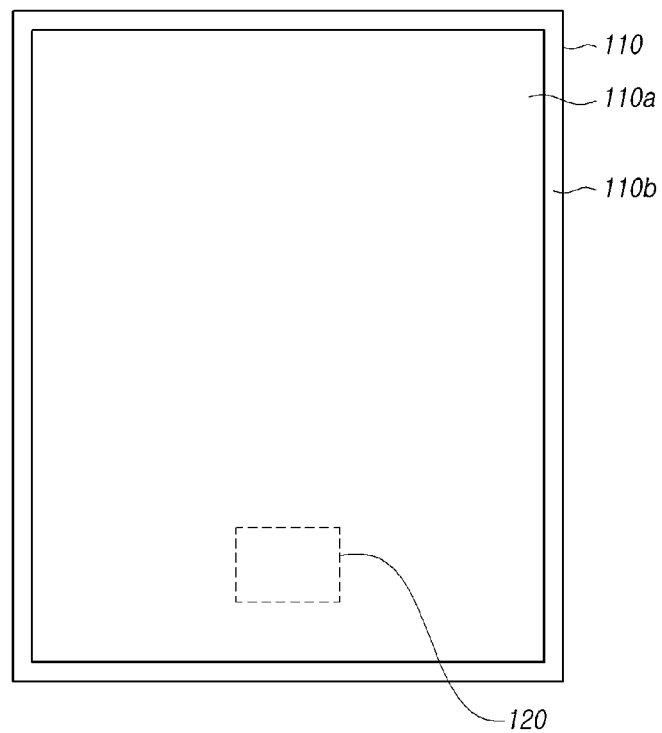
FIG. 2 is a plan view illustrating a display panel and a sensor according to various embodiments of the disclosure.

FIG. 2 is a plan view illustrating a display panel and a sensor according to various embodiments of the disclosure.

Referring to FIG. 2, a sensor 120 disposed on the back surface of a display panel 110 is shown in dashed lines. As the sensor 120 is disposed on the back surface of the display panel 110, the display panel 110 and the sensor 120 may overlap each other. The display panel 110 may include a display area 110a for displaying images and a bezel area 110b corresponding to the surrounding edge of the display area 110a and having wiring for supplying signals and/or voltages to the display panel 110 placed therein.

The sensor 120 may be disposed to overlap the display area 110a. Placing the sensor 120 to overlap the display area 110a may reduce the bezel area 110b, thus facilitating to apply a narrow bezel to the display device 100.

Although the sensor 120 is shown in a rectangular shape, the sensor 120 may be formed in a circular, elliptical, or other various shapes, without limitation thereto. Although the sensor 120 is shown as overlapping a portion of the display area 110a, embodiments of the disclosure are not limited thereto, but the sensor may rather be sized to correspond to the overall size of the display area 110a.

Figure 3:
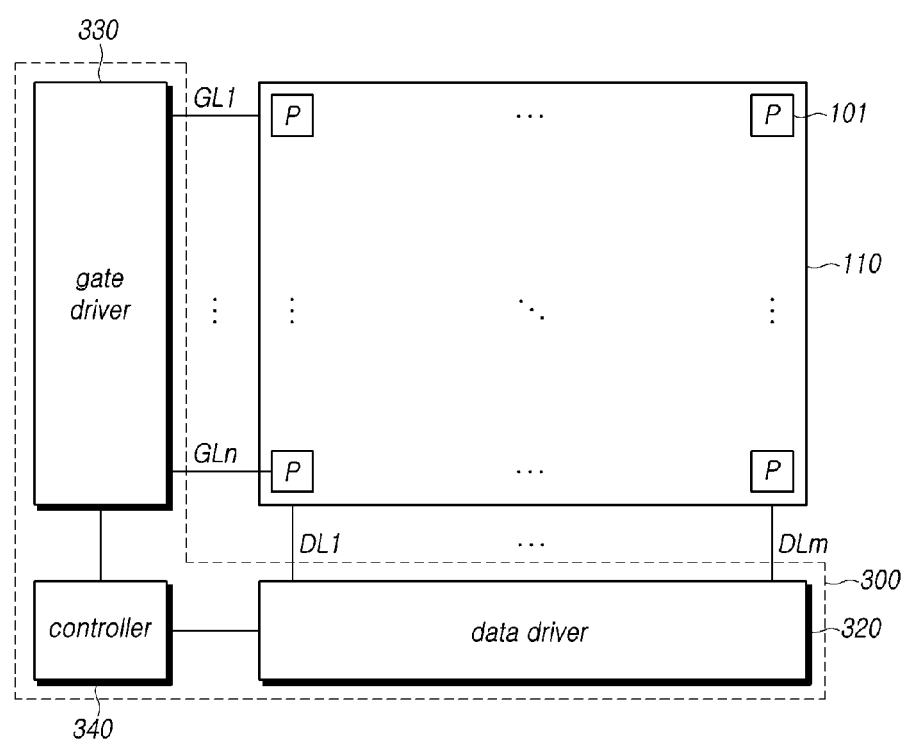
FIG. 3 is a view illustrating a structure of a display panel of a display device and a display driving circuit for driving the display panel according to various embodiments of the disclosure.

FIG. 3 is a view illustrating a structure of a display panel of a display device and a display driving circuit for driving the display panel according to various embodiments of the disclosure.

Referring to FIG. 3, a display device 100 may include a display panel 110 including display pixels 101 with light emitting devices and a display driving circuit 300 for driving the display panel 110.

The display panel 110 may display images. The display panel 110 may include a plurality of data lines DL1, . . . , DLm and a plurality of gate lines GL1, . . . , GLn. The display panel 110 may include the plurality of display pixels 101 connected with the plurality of data lines DL1, . . . , DLm and the plurality of gate lines GL1, . . . , GLn. However, the lines arranged on the display panel 110 are not limited thereto. The light emitting devices included in the plurality of display pixels 101 may emit any one of red, green, blue, and white light. However, the color of light emitted from the light emitting devices is not limited thereto.

The display driving circuit 300 may include a data driver 320 for supplying data signals, a gate driver 330 for supplying gate signals, and a controller 340 for controlling the display pixels 101. However, the elements included in the display driving circuit 300 are not limited thereto.

The display panel 110 may receive data signals by gate signals. As the data signals, data voltages Vdata with voltage levels corresponding to grayscales may be transferred to the data lines DL1, . . . , DLm. The display pixels 101 may receive data voltages Vdata by gate signals. Although the data driver 320 and the gate driver 330 included in the display driving circuit 300 are shown as individual ones, embodiments of the disclosure are not limited thereto. For example, the display driving circuit 300 may include a plurality of data drivers corresponding to the resolution and size of the display panel 110. Gate drivers may be disposed on the left and right of the display panel 110. The gate driver 330 may be formed simultaneously with the display panel 110. The data driver 320 and the gate driver 330 may be integrated circuits (ICs).

The controller 340 may control the gate driver 330 and the data driver 320. Under the control of the controller 340, the data driver 320 may output data signals, and the gate driver 330 may output gate signals. The controller 340 may transfer image signals to the data driver 320, and the data driver 320 may convert the received image signals into data signals and output the data signals to the display panel 110 under the control of the controller 340. Gate signals output from the gate driver 330 may be output to the display panel 110. The controller 340 may be a timing controller.

Figure 4:
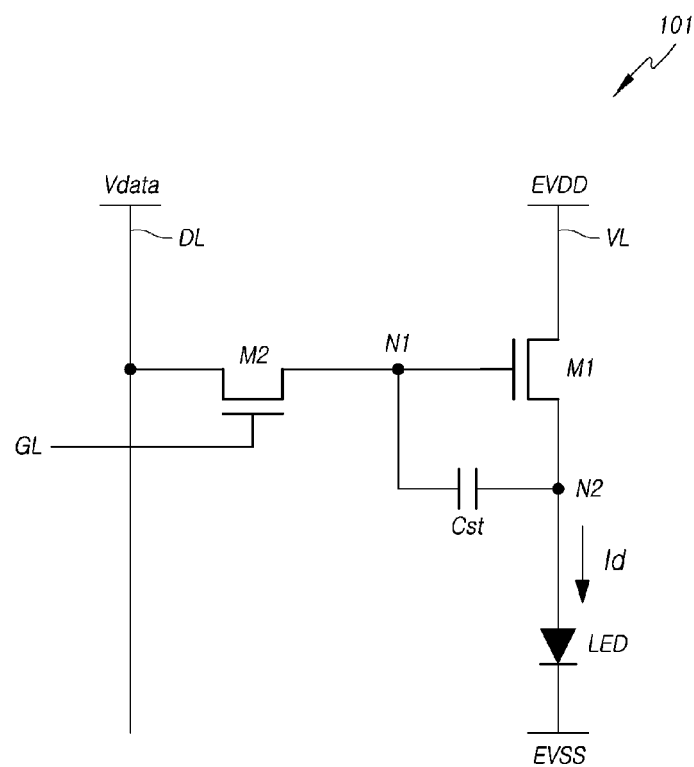
FIG. 4 is a circuit diagram illustrating a display pixel according to various embodiments of the disclosure.

FIG. 4 is a circuit diagram illustrating a display pixel according to various embodiments of the disclosure.

Referring to FIG. 4, a display pixel 101 may include a first transistor M1 that receives a first pixel driving voltage EVDD and a data voltage Vdata and generate a driving current Id corresponding to the data voltage Vdata and supplies the driving current Id to a light emitting device LED, a second transistor M2 that transfers the data voltage Vdata to the first transistor M1, in response to a gate signal, and a capacitor Cst that retains the data voltage Vdata transferred to the first transistor M1. The first transistor M1 may be a driving transistor for supplying driving current.

The gate electrode of the first transistor M1 may be connected to a first node N1. A first electrode of the first transistor M1 may be connected to a driving power line VL for transferring the first pixel driving voltage EVDD, and a second electrode of the first transistor M1 may be connected to a second node N2.

The gate electrode of the second transistor M2 may be connected with a gate line GL. A first electrode of the second transistor M2 may be connected to a data line DL for transferring the data voltage Vdata, and a second electrode of the second transistor M2 may be connected to the first node N1. The capacitor Cst may be disposed between the first node N1 and the second node N2.

The light emitting device LED may include an anode electrode, a cathode electrode, and a light emitting layer disposed between the anode electrode and the cathode electrode. The anode electrode may be connected to the second node N2, and the cathode electrode may be connected to a second pixel driving voltage EVSS. The second pixel driving voltage EVSS may be lower in voltage level than the first pixel driving voltage EVDD. The second pixel driving voltage EVSS may be a ground. The light emitting layer may include an organic or inorganic film.

In the so-configured display pixel 101, when a gate signal transferred via the gate line GL to the gate electrode of the second transistor M2, the data voltage Vdata may be transferred to the first node N1. When the data voltage Vdata is transferred to the first node N1, the first transistor M1 transfers a driving current Ida corresponding to the data voltage Vdata to the second node N2, allowing the driving current Id to flow to the light emitting device LED.

Figure 5A:
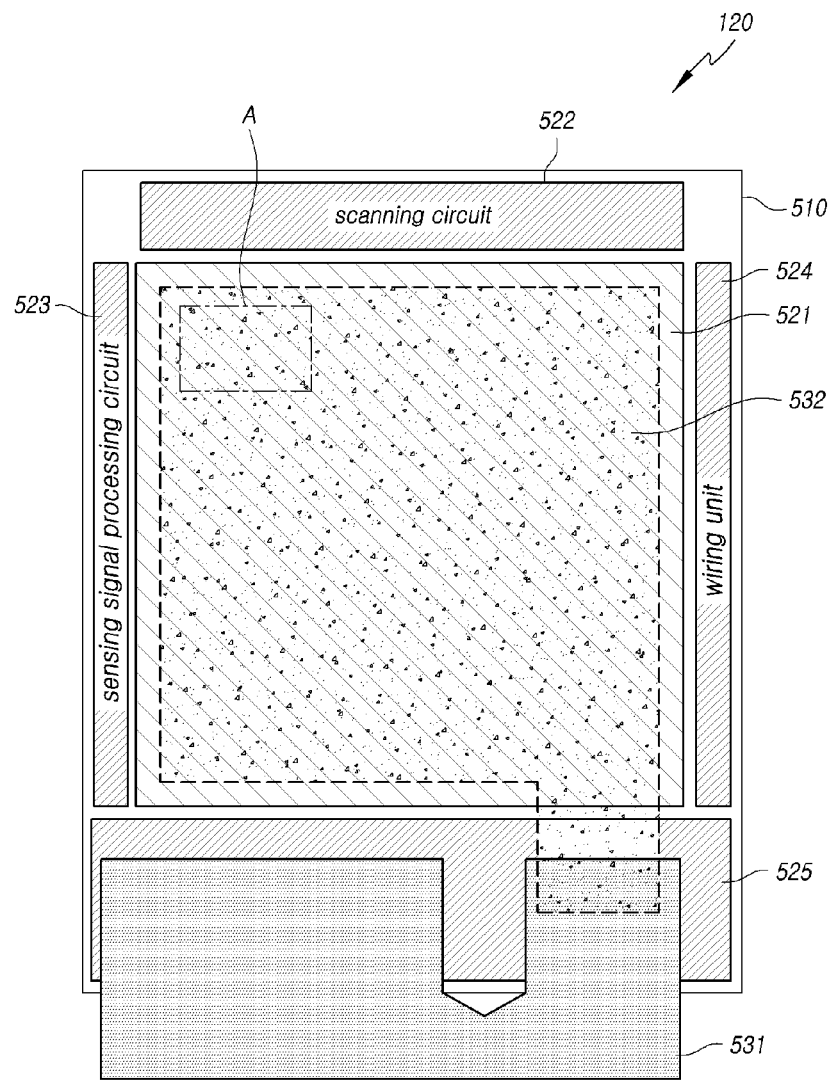
FIG. 5A is a plan view illustrating an example sensor according to various embodiments of the disclosure.
Figure 5B:
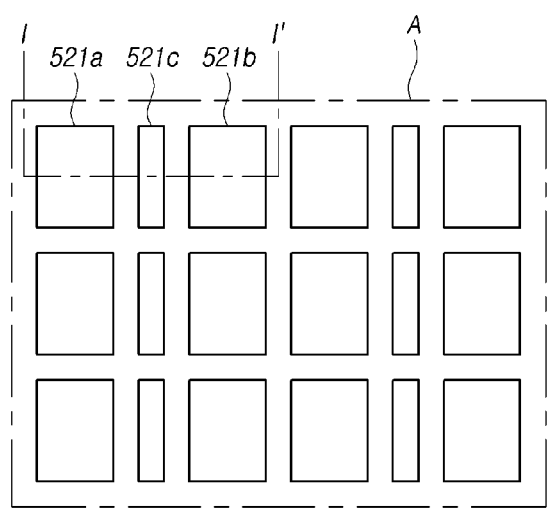
FIG. 5B is an enlarged, plan view illustrating portion A of FIG. 5A according to one embodiment of the disclosure.

FIG. 5A is a plan view illustrating an example sensor according to various embodiments of the disclosure. FIG. 5B is an enlarged, plan view illustrating portion A of FIG. 5A.

Referring to FIG. 5A, a sensor 120 may include a sensor pixel array 521 that is disposed on a first substrate 510 and includes a plurality of sensor pixels. The sensor 120 may also include a scanning circuit 522 and a sensing signal processing circuit 523 disposed on the first substrate 510 and around the sensor pixel array 521. A wiring unit 524 may be disposed around the sensor pixel array 521. The first substrate 510 may include a connection unit 525.

A common electrode layer 532 may be disposed on the sensor pixel array 521. Although the common electrode layer 532 is shown as a single layer, embodiments of the disclosure are not limited. For example, the common electrode layer 532 may be implemented with a plurality of common electrode lines disposed in parallel in a predetermined direction.

The scanning circuit 522 may sequentially transfer scan signals to a plurality of sensor pixels arranged in the sensor pixel array 521. The plurality of sensor pixels in the sensor pixel array 521 may be arranged in the form of a matrix with rows and columns. The scan signals from the scanning circuit 522 may select the rows of the sensor pixels and allow the plurality of sensors to sequentially operate. The sensing signal processing circuit 523 may receive a plurality of sensing signals from the plurality of sensor pixels. The wiring unit 524 may be where wires for supplying voltages necessary for driving the sensor may be arranged, and the wiring unit 524 may transfer voltages for driving the sensor to the plurality of sensor pixels. The voltages necessary for driving the sensor may be the ground. However, embodiments of the disclosure are not limited thereto.

The first substrate 510 may include the connection unit 525. The connection unit 525 may be where other elements are connected to the first substrate 510. A flexible printed circuit cable 531 may be connected to the connection unit 525. A pad (not shown) connected with the flexible printed circuit cable 531 may be disposed on the connection unit 525.

The sensor 120 may receive signals and/or voltages supplied to the scanning circuit 522, sensing signal processing circuit 523, and wiring unit 524 from the flexible printed circuit cable 531 connected with the connection unit 525. The common electrode layer 532 may receive a predetermined voltage from the flexible printed circuit cable 531. The sensing signal transferred to the sensing signal processing circuit 523 may be transferred via the flexible printed circuit cable 531 to the outside.

Referring to FIG. 5B, the sensor 120 may include a first element area including a plurality of first transmission circuit areas 521a and a plurality of first reception circuit areas 521b. A transistor or transistors may be disposed in each of the first transmission circuit areas 521a and the first reception circuit areas 521b. The transistors disposed in the first transmission circuit areas 521a and the first reception circuit areas 521b may receive scan signals from the scanning circuit 522 and be sequentially operated. A first piezoelectric material layer and a second piezoelectric material layer may be stacked on the first transmission circuit area 521a and the first reception circuit area 521b. A first element area may be disposed between the first transmission circuit area 521a and the first reception circuit area 521b. The first piezoelectric material layer and/or the second piezoelectric material layer may include a first connection circuit area 521c where a connection circuit for transmitting/receiving signals to/from the transistors disposed in the first transmission circuit area 521a and the first reception circuit area 521b is disposed.

Although the first transmission circuit area 521a, the first reception circuit area 521b, and the first connection circuit area 521c each are shaped in a rectangular shape, embodiments of the disclosure are not limited thereto.

The sensor 120 may further include a second element area including a plurality of second transmission circuit areas and a plurality of second reception circuit areas. The second element area may be disposed under the first element area to overlap the first element area. When the sensor 120 further includes the second element area, the first piezoelectric material layer may be disposed on the first element area, and the second piezoelectric material layer may be disposed on the second element area. A transistor or transistors may be disposed in each of the second transmission circuit areas and the second reception circuit areas, and each transistor may transmit/receive signals to/from the second piezoelectric material layer via a connection circuit included in a second connection circuit area.

Figure 6:
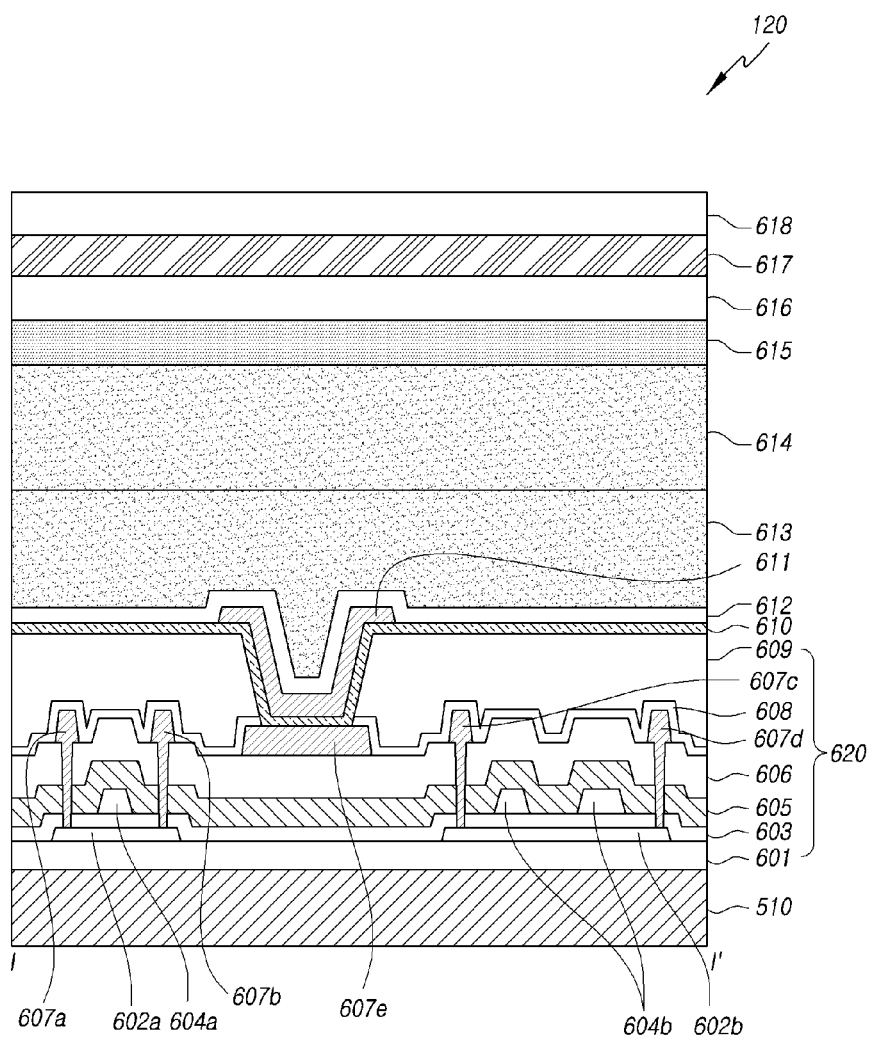
FIG. 6 is a cross-sectional view taken along line I-I' of FIG. 5B according to one embodiment of the disclosure.

FIG. 6 is a cross-sectional view taken along line I-I' of FIG. 5B according to one embodiment of the disclosure.

Referring to FIG. 6, a sensor 120 may include a first piezoelectric material layer 614, a second piezoelectric material layer 613 disposed under the first piezoelectric material layer 614 to overlap the first piezoelectric material layer 614, a first common electrode layer 615 disposed over the first piezoelectric material layer 614, a first sensor pixel electrode 610 disposed under the second piezoelectric material layer 613, and a first element layer 620 disposed under the first sensor pixel electrode 610 and connected with the first sensor pixel electrode 610. The first piezoelectric material layer 614 may generate signals with a lower frequency than the second piezoelectric material layer 613.

The sensor 120 may include a first substrate 510. A first buffer layer 601 may be disposed on the first substrate 510. The first substrate 510 may include polyamide. However, the material of the first substrate 510 is not limited thereto. A first active layer 602a and a second active layer 602b may be disposed on the first buffer layer 601. A first gate insulation film 603 may be disposed on the first buffer layer 601 where the first active layer 602a and the second active layer 602b are disposed. A first gate electrode 604a may be disposed over the first gate insulation film 603 to overlap the first active layer 602a, and a second gate electrode 604b may be disposed to overlap the second active layer 602b. The second gate electrode 604b may include two gate electrodes.

A first inter-layer insulation film 605 and a second inter-layer insulation layer 606 may be formed on the first gate insulation film 603 where the first gate electrode 604a and the second gate electrode 604b are arranged. A first source electrode 607a, a first drain electrode 607b, a second source electrode 607c, and a second drain electrode 607d may be disposed on the second inter-layer insulation film 606. A first connection electrode 607e may be disposed over the second inter-layer insulation film 606 to connect the first drain electrode 607b with the second source electrode 607c. The first connection electrode 607e may include the same material as the first source electrode 607a, the first drain electrode 607b, the second source electrode 607c, and the second drain electrode 607d.

The first active layer 602a, and the first gate electrode 604a, the first source electrode 607a, and the first drain electrode 607b disposed over the first active layer 602a may correspond to the transistor disposed in the first transmission circuit area 521a as shown in FIG. 5B. The second active layer 602b and the second gate electrode 604b, the second source electrode 607c, and the second drain electrode 607d disposed over the second active layer 602b may correspond to the transistor disposed in the first reception circuit area 521b as shown in FIG. 5B.

A first protection film 608 may be disposed on the first source electrode 607a, the first drain electrode 607b, the second source electrode 607c, the second drain electrode 607d, and the first connection electrode 607e. A first flattening film 609 may be disposed on the first protection film 608.

A first sensor pixel electrode 610 may be disposed on the first flattening film 609. The first protection film 608 and the first flattening film 609 may individually have contact holes that overlap each other. Through the contact holes, the first sensor pixel electrode 610 may connect to the first connection electrode 607e. A second connection electrode 611 may be disposed on the first sensor pixel electrode 610 in a position corresponding to the contact holes. Thus, the second connection electrode 611 may connect to the first connection electrode 607e via the contact holes. A second protection film 612 may be disposed on the first sensor pixel electrode 610. The first connection electrode 607e and the second connection electrode 611 connected with each other may correspond to the connection circuit disposed in the first connection circuit area 521c as shown in FIG. 5B.

A first piezoelectric material layer 614 may be disposed on the second protection film 612. A second piezoelectric material layer 613 may be disposed on the second protection film 612 and under the first piezoelectric material layer 614. The first piezoelectric material layer 614 may generate a first ultrasonic wave signal corresponding to a low-frequency signal, and the second piezoelectric material layer 613 may generate a second ultrasonic wave signal corresponding to a high-frequency signal. A first common electrode layer 615 may be disposed on the first piezoelectric material layer 614. A first adhesive layer 616, a film layer 617, and a protection film layer 618 may be stacked on the first common electrode layer 615. The first piezoelectric material layer 614 may differ in thickness from the second piezoelectric material layer 613.

In the so-implemented sensor 120, when a low-frequency signal is transferred to the first sensor pixel electrode 610, the first piezoelectric material layer 614 may output a first ultrasonic wave signal corresponding to the low-frequency signal. In the sensor 120, when a high-frequency signal is transferred to the first sensor pixel electrode, the second piezoelectric material layer 613 may output a second ultrasonic wave signal corresponding to the high-frequency signal. The low-frequency signal may pass through a piezoelectric material corresponding to a high frequency, but the high-frequency signal may not pass through a piezoelectric material corresponding to a low frequency. Thus, the second piezoelectric material layer 613 corresponding to the high-frequency signal may be positioned closer to the object than the first piezoelectric material layer 614 is.

The first ultrasonic wave signal or second ultrasonic wave signal may be radiated to the substrate 510 and be reflected by the object (not shown) disposed under the substrate 510. A display panel 110 and a cover glass 140 as shown in FIG. 1 may be disposed under the substrate 510. The object may be positioned under the cover glass 140.

Figure 7:
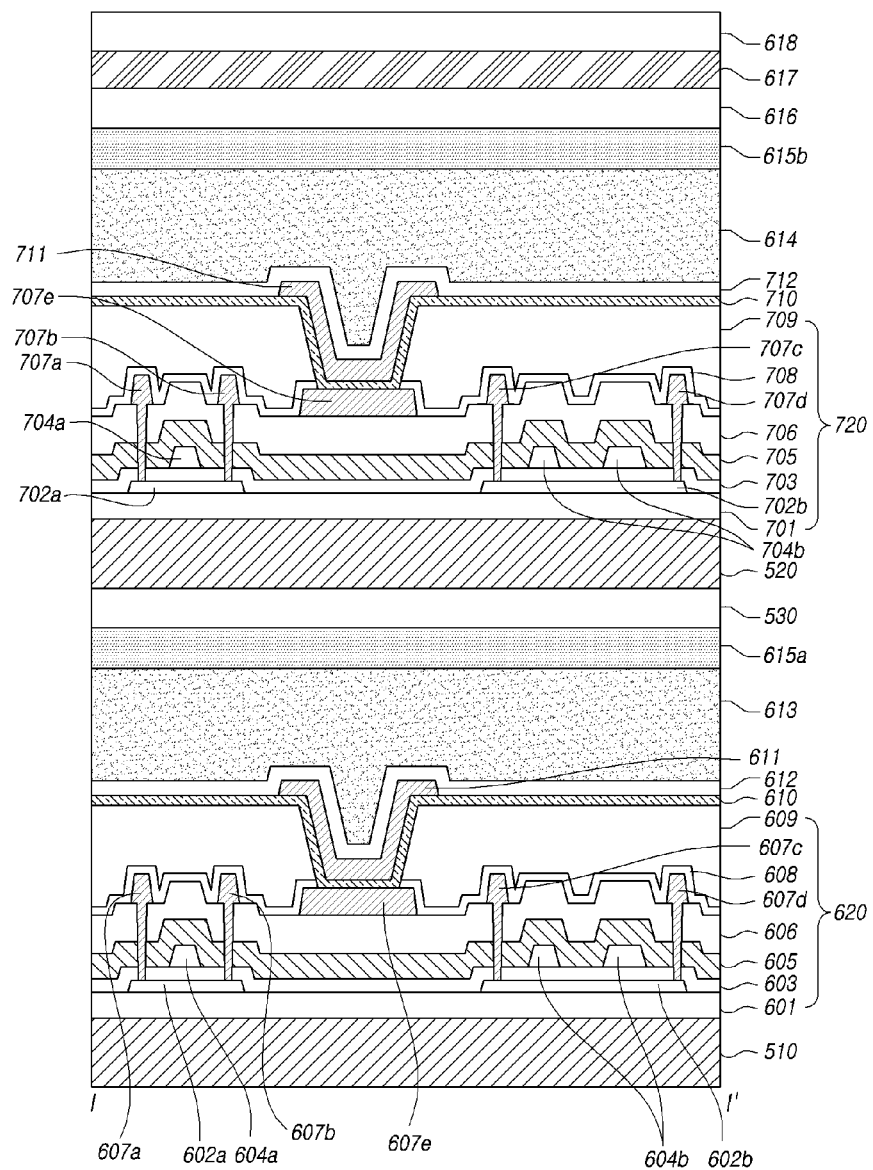
FIG. 7 is a cross-sectional view taken along line I-I' of FIG. 5B according to one embodiment of the disclosure.

FIG. 7 is a cross-sectional view taken along line I-I' of FIG. 5B according to one embodiment of the disclosure.

Referring to FIG. 7, a sensor 120 may include a first piezoelectric material layer 614, a second piezoelectric material layer 613 disposed under the first piezoelectric material layer 614 to overlap the first piezoelectric material layer 614, a first common electrode layer 615b disposed over the first piezoelectric material layer 614, a first sensor pixel electrode 610 disposed under the second piezoelectric material layer 613, and a first element layer disposed under the first sensor pixel electrode 610 and connected with the first sensor pixel electrode 610.

A sensor 120 may include a second common electrode layer 615a disposed over the second piezoelectric material layer 613 between the first piezoelectric material layer 614 and the second piezoelectric material layer 613, a second sensor pixel electrode 710 disposed under the second common electrode layer 615a, and a second element layer 720 disposed under the second sensor pixel electrode 710 and connected with the second sensor pixel electrode 710.

When including the second piezoelectric material layer 613, the sensor 120 may be denoted as a first sensor and, when including the first piezoelectric material layer 614, the sensor 120 may be denoted as a second sensor. The first sensor may include the second piezoelectric material layer 613 disposed on the first substrate 510 and the second common electrode layer 615a disposed on the second piezoelectric material layer 613. The second sensor may include the first piezoelectric material layer 614 disposed on a second substrate 520 and a first common electrode layer 615*b* disposed on the second piezoelectric material layer 613.

The first sensor may transmit/receive a second ultrasonic wave signal corresponding to a high-frequency signal by the second piezoelectric material layer 613. The second sensor may transmit/receive a first ultrasonic wave signal corresponding to a low-frequency signal by the first piezoelectric material layer 614. The low-frequency signal may pass through a piezoelectric material corresponding to a high frequency, but the high-frequency signal may not pass through a piezoelectric material corresponding to a low frequency. Thus, the second piezoelectric material layer 613 corresponding to the high-frequency signal may be positioned closer to the object than the first piezoelectric material layer 614 is.

The first sensor may include the first substrate 510. A first buffer layer 601 may be disposed on the first substrate 510. The first substrate 510 may include polyamide. However, the material of the first substrate 510 is not limited thereto. A first active layer 602*a* and a second active layer 602*b* may be disposed on the first buffer layer 601. A first gate insulation film 603 may be disposed on the first buffer layer 601 where the first active layer 602*a* and the second active layer 602*b* are disposed. A first gate electrode 604*a* may be disposed on the first gate insulation film 603 to overlap the first active layer 602*a*, and a second gate electrode 604*b* may be disposed to overlap the second active layer 602*b*. The second gate electrode 604*b* may include two gate electrodes.

A first inter-layer insulation film 605 and a second inter-layer insulation layer 606 may be formed on the first gate insulation film 603 where the first gate electrode 604*a* and the second gate electrode 604*b* are arranged. A first source electrode 607*a*, a first drain electrode 607*b*, a second source electrode 607*c*, and a second drain electrode 607*d* may be disposed on the second inter-layer insulation film 606. A first connection electrode 607*e* may be disposed on the second inter-layer insulation film 606 to connect the first drain electrode 607*b* with the second source electrode 607*c*. A first protection film 608 may be disposed on the first source electrode 607*a*, the first drain electrode 607*b*, the second source electrode 607*c*, the second drain electrode 607*d*, and the first connection electrode 607*e*. The first connection electrode 607*e* may include the same material as the first source electrode 607*a*, the first drain electrode 607*b*, the second source electrode 607*c*, and the second drain electrode 607*d*. A first flattening film 609 may be disposed on the first protection film 608.

The first active layer 602*a*, and the first gate electrode 604*a*, the first source electrode 607*a*, and the first drain electrode 607*b* disposed on the first active layer 602*a* may correspond to the transistor disposed in the second transmission circuit area as shown in FIG. 5B. The second active layer 602*b* and the second gate electrode 604*b*, the second source electrode 607*c*, and the second drain electrode 607*d* disposed on the second active layer 602*b* may correspond to the transistor disposed in the second reception circuit area as shown in FIG. 5B.

A first sensor pixel electrode 610 may be disposed on the first flattening film 609. The first protection film 608 and the first flattening film 609 may individually have contact holes through which the first sensor pixel electrode 610 may connect to the first connection electrode 607*e*. A second connection electrode 611 may be disposed on the first sensor pixel electrode 610 in a position corresponding to the contact holes. Thus, the second connection electrode 611 may connect to the first connection electrode 607*e* via the contact holes. A second protection film 612 may be disposed on the first sensor pixel electrode 610. The first connection electrode 607*e* and the second connection electrode 611 connected with each other may correspond to the connection circuit disposed in the second connection circuit area as shown in FIG. 5B.

The second piezoelectric material layer 613 may be disposed on the second protection film 612. The second piezoelectric material layer 613 may generate a second ultrasonic wave signal corresponding to a high-frequency signal. The second common electrode layer 532 may be disposed on the second piezoelectric material layer 613.

The second sensor may be disposed on the first sensor. The second substrate 520 included in the second sensor may be disposed on the first substrate 510. A second buffer layer 701 may be disposed on the second substrate 520. The second substrate 520 may include polyamide. However, the material of the second substrate 520 is not limited thereto. A third active layer 702*a* and a fourth active layer 702*b* may be disposed on the second buffer layer 701. A second gate insulation film 703 may be disposed on the second buffer layer 701 where the third active layer 702*a* and the fourth active layer 702*b* are disposed. On the second gate insulation film 703, a third gate electrode 704*a* may be disposed to overlap the third active layer 702*a*, and a fourth gate electrode 704*b* may be disposed to overlap the fourth active layer 702*b*. The fourth gate electrode 704*b* may include two gate electrodes.

A third inter-layer insulation film 705 and a fourth inter-layer insulation layer 706 may be formed on the second gate insulation film 703 where the third gate electrode 704*a* and the fourth gate electrode 704*b* are arranged. A third source electrode 707*a*, a third drain electrode 707*b*, a fourth source electrode 707*c*, and a fourth drain electrode 707*d* may be disposed on the fourth inter-layer insulation film 706. A fourth connection electrode 707*e* may be disposed on the fourth inter-layer insulation film 706 to connect the third drain electrode 707*b* with the fourth source electrode 707*c*. The third connection electrode 707*e* may include the same material as the third source electrode 707*a*, the third drain electrode 707*b*, the fourth source electrode 707*c*, and the fourth drain electrode 707*d*. A third protection film 708 may be disposed on the third source electrode 707*a*, the third drain electrode 707*b*, the fourth source electrode 707*c*, the fourth drain electrode 707*d*, and the third connection electrode 707*e*. A second flattening film 709 may be disposed on the third protection film 708.

The third active layer 702*a*, and the third gate electrode 704*a*, the third source electrode 707*a*, and the third drain electrode 707*b* disposed on the third active layer 702*a* may correspond to the transistor disposed in the first transmission circuit area 521*a* as shown in FIG. 5B. The fourth active layer 702*b* and the fourth gate electrode 704*b*, the fourth source electrode 707*c*, and the fourth drain electrode 707*d* disposed on the fourth active layer 702*b* may correspond to the transistor disposed in the first reception circuit area 521*b* as shown in FIG. 5B.

A second sensor pixel electrode 710 may be disposed on the second flattening film 709. The third protection film 708 and the second flattening film 709 may individually have contact holes that overlap each other. Through the contact holes, the second sensor pixel electrode 710 may connect to the third connection electrode 707*e*. A fourth connection electrode 711 may be disposed on the second sensor pixel electrode 710 in a position corresponding to the contact holes. Thus, the fourth connection electrode 711 may connect to the third connection electrode 707e via the contact holes. The fourth connection electrode 711 may include the same material as the third connection electrode 707e. A fourth protection film 712 may be disposed on the second sensor pixel electrode 710. The third connection electrode 707e and the fourth connection electrode 711 connected with each other may correspond to the connection circuit disposed in the first connection circuit area 521c as shown in FIG. 5B.

A first piezoelectric material layer 614 may be disposed on the fourth protection film 712. The first piezoelectric material layer 614 may generate a first ultrasonic wave signal corresponding to a low-frequency signal. A first common electrode layer 615b may be disposed on the first piezoelectric material layer 614. A first adhesive layer 616 may be disposed on the first common electrode layer 615b, and a film layer 617 and a protection film layer 618 may be stacked on the first adhesive layer 616.

A second adhesive layer 530 may be disposed between the second common electrode layer 532 and the second substrate 520. The second substrate 520 and the second common electrode layer 532 may be attached and fastened by the second adhesive layer 530.

In the so-implemented sensor 120, when a high-frequency signal is transferred via the first sensor pixel electrode 610, the second piezoelectric material layer 613 may output a second ultrasonic wave signal corresponding to the high-frequency signal. When a low-frequency signal is transferred via the second sensor pixel electrode 710, the first piezoelectric material layer 614 may output a first ultrasonic wave signal corresponding to the low-frequency signal.

The first piezoelectric material layer 614 may differ in thickness from the second piezoelectric material layer 613. The first ultrasonic wave signal or second ultrasonic wave signal may be radiated to the substrate 510 and be reflected by the object (not shown) disposed under the substrate 510. A display panel 110 and a cover glass 140 as shown in FIG. 1 may be disposed under the substrate 510. The object may be positioned under the cover glass 140.

Figure 8:
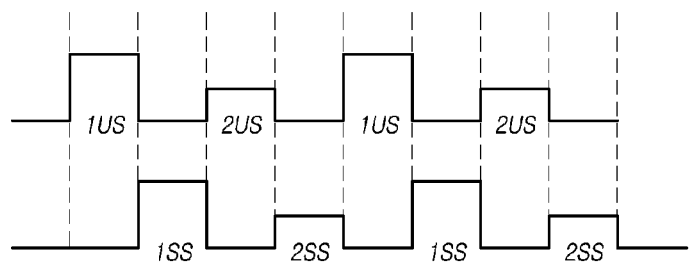
FIG. 8 is a waveform view illustrating operations of a sensor according to various embodiments of the disclosure.

FIG. 8 is a waveform view illustrating operations of a sensor according to various embodiments of the disclosure according to one embodiment of the disclosure.

Referring to FIG. 8, a sensor 120 may output a first ultrasonic wave signal 1US corresponding to a low-frequency signal and then a second ultrasonic wave signal 2US corresponding to a high-frequency signal. The sensor 120 may alternately output the first ultrasonic wave signal 1US corresponding to the low-frequency signal and the second ultrasonic wave signal 2US corresponding to the high-frequency signal. In particular, when the sensor 120 is configured as shown in FIG. 6, a first sensor pixel electrode 610 may alternately output the low-frequency signal and the high-frequency signal. A first piezoelectric material layer 614 may output the first ultrasonic wave signal corresponding to the low-frequency signal output from the first sensor pixel electrode 610, and a second piezoelectric material layer 613 may output the second ultrasonic wave signal corresponding to the high-frequency signal output from the first sensor pixel electrode 610.

The first ultrasonic wave signal 1US output from the first piezoelectric material layer 614 and the second ultrasonic wave signal 2US output from the second piezoelectric material layer 613 may be reflected by an object. When the first ultrasonic wave signal 1US output from the first piezoelectric material layer 614 is reflected, the first piezoelectric material layer 614 may receive a sensing signal 1SS corresponding to the low-frequency signal, in response to the first ultrasonic wave signal 1US. When the second ultrasonic wave signal 2US output from the second piezoelectric material layer 613 is reflected, the second piezoelectric material layer 613 may receive a sensing signal 2SS corresponding to the high-frequency signal, in response to the second ultrasonic wave signal 2US.

Figure 9:
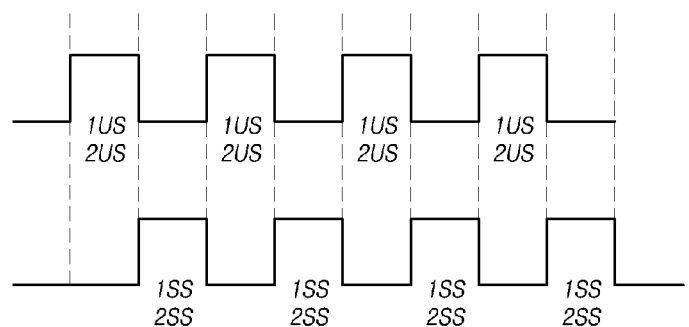
FIG. 9 is a waveform view illustrating operations of a sensor according to various embodiments of the disclosure.

FIG. 9 is a waveform view illustrating operations of a sensor according to various embodiments of the disclosure.

Referring to FIG. 9, a sensor 120 may simultaneously output a first ultrasonic wave signal 1US corresponding to a low-frequency signal and a second ultrasonic wave signal 2US corresponding to a high-frequency signal. In particular, when the sensor 120 is configured as shown in FIG. 7, a first sensor pixel electrode 610 may output the low-frequency signal, and a second sensor pixel electrode 710 may output the high-frequency signal.

Corresponding to the high-frequency signal output from the first sensor pixel electrode 610, a second piezoelectric material layer 613 may generate and output the second ultrasonic wave signal 2US. Corresponding to the low-frequency signal output from the second sensor pixel electrode 710, a first piezoelectric material layer 614 may generate and output the first ultrasonic wave signal 1US.

The first ultrasonic wave signal 1US output from the first piezoelectric material layer 614 and the second ultrasonic wave signal 2US output from the second piezoelectric material layer 613 may simultaneously be reflected by an object. When the first ultrasonic wave signal 1US output from the first piezoelectric material layer 614 is reflected, the first piezoelectric material layer 614 may generate a sensing signal 1SS corresponding to the high-frequency signal, in response to the first ultrasonic wave signal 1US and, simultaneously, when the second ultrasonic wave signal 2US output from the second piezoelectric material layer 613 is reflected, the second piezoelectric material layer 613 may generate a sensing signal 2SS corresponding to the high-frequency signal, in response to the second ultrasonic wave signal 2US.

Thus, the sensor 120 may simultaneously generate the sensing signal 1SS corresponding to the low-frequency signal and the sensing signal 2SS corresponding to the high-frequency signal.

Figure 10:
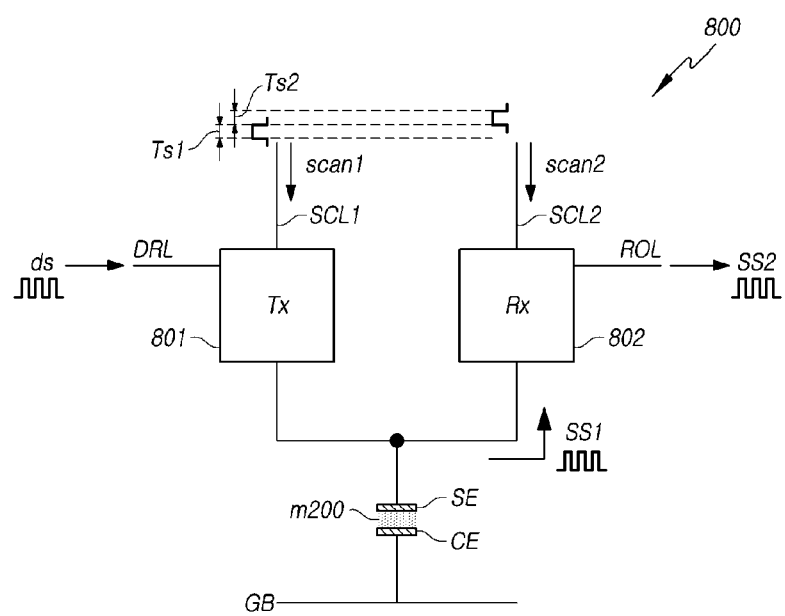
FIG. 10 is a view illustrating a structure of a sensor pixel according to various embodiments of the disclosure.

FIG. 10 is a view illustrating a structure of a sensor pixel according to various embodiments of the disclosure.

Referring to FIG. 10, among sensor pixels 800, sensor pixels included in a first element layer may be referred to as first sensor pixels, and sensor pixels included in a second element layer may be referred to as second sensor pixels. A first sensor pixel included in the first element layer may include a first transmission circuit that transfers a first driving signal to a first sensor pixel electrode and a first reception circuit that receives a sensing signal from the first sensor pixel electrode.

Among the sensor pixels 800, a second sensor pixel included in the second element layer may include a second transmission circuit that transfers a second driving signal to a second sensor pixel electrode and a second reception circuit that receives a sensing signal from the second sensor pixel electrode. A first scan signal scan1 and a second scan signal scan2 may be scan signals that are input to the first transmission circuit and the first reception circuit, respectively, included in the first element layer. Scan signals input to the second transmission circuit and the second reception circuit included in the second element layer may be referred to as a third scan signal scan3 and a fourth scan signal scan4, respectively.

The first sensor pixel and the second sensor pixel included in the first element layer and the second element layer, respectively, may have the same structure. Thus, for ease of description, the first sensor pixel electrode and the second sensor pixel electrode may be collectively referred to as a sensor pixel electrode, and the first transmission circuit and second transmission circuit may be collectively referred to as a transmission circuit while the first reception circuit and the second reception circuit may be collectively referred to as a reception circuit.

The sensor pixel 800 may include a sensor pixel electrode SE, a transmission circuit 801 that outputs a driving signal ds with a predetermined frequency to the sensor pixel electrode SE during a first period Ts1, and a reception circuit 802 that receives, from the sensor pixel electrode SE, a sensing signal generated by a reflection of a first ultrasonic wave signal or second ultrasonic wave signal corresponding to the driving signal ds during a second period Ts2.

The transmission circuit 801 may receive the driving signal ds from a driving signal line DRL during each of a plurality of driving periods that sequentially occur and transfer the driving signal ds to the sensor pixel electrode SE, and the reception circuit 802 may receive the sensing signal from the sensor pixel electrode SE during each of a plurality of sensing periods that sequentially occur and transfer the sensing signal to a first lead-out line ROL. The plurality of driving periods may include a driving period during which the driving signal is output as a low-frequency signal and a second driving period during which the driving signal is output as a high-frequency signal. In the plurality of driving periods, a first driving signal may be output as a high-frequency signal, and a second driving signal may be output as a low-frequency signal. The first driving signal may be a driving signal transferred to the first sensor pixel electrode 610 disposed in the first element layer, and the second driving signal may be a driving signal transferred to the second sensor pixel electrode 710 disposed in the second element layer.

A piezoelectric material m200 may be disposed between the sensor pixel electrode SE and a common electrode CE. The piezoelectric material m200 may correspond to a first piezoelectric material layer 614 or a second piezoelectric material layer 613. When the sensor pixel is applied to a sensor as shown in FIG. 6, the piezoelectric material m200 may partially correspond to the first piezoelectric material layer 614 and the second piezoelectric material layer 613 that are stacked one over the other. When the sensor pixel is applied to a sensor as shown in FIG. 7, the piezoelectric material m200 may be part of the first piezoelectric material layer 614 or second piezoelectric material layer 613 depending on which one of the first element layer or second element layer the sensor pixel electrode is included in.

The transmission circuit 801 and the reception circuit 802 may be connected to the sensor pixel electrode SE. The sensor pixel electrode SE may correspond to part of the first sensor pixel electrode 610 when applied to the sensor 120 of FIG. 6 and may correspond to part of the first sensor pixel electrode 610 or second sensor pixel electrode 710 when applied to the sensor 120 of FIG. 7.

A bias voltage GB, which is a constant voltage, may be transferred to the common electrode CE. When applied to the sensor 120 of FIG. 6, the common electrode CE may be part of the first common electrode layer 615 and, when applied to the sensor 120 of FIG. 7, the common electrode CE may be part of the first common electrode layer 615b or the second common electrode layer 615a.

During the first period Ts1, the first scan signal scant may be transferred to the transmission circuit 801 and, during the second period Ts2, the second scan signal scan2 may be transferred to the reception circuit 802. In other words, after the first scan signal scant is transferred to the transmission circuit 801, the second signal scan2 may be transferred to the reception circuit 802. Upon receiving the first scan signal scant, the transmission circuit 801 may start to operate and, upon receiving the second scan signal scan2, the reception circuit 802 may start to operate. This may prevent the reception circuit 802 from operating in the first period Ts1 and the transmission circuit 801 from operating in the second period Ts2.

In the first period Ts1, the transmission circuit 801 may operate, and a driving signal ds with a predetermined frequency may be applied to the driving signal line DRL. The driving signal ds may be transferred via the transmission circuit 801 to the sensor pixel electrode SE. As the bias voltage GB is being transferred to the common electrode CE, the piezoelectric material m200 may output an ultrasonic wave signal corresponding to the driving signal ds. However, signals output from the piezoelectric material m200 are not limited to ultrasonic wave signals.

In a case where the piezoelectric material m200 corresponds to part of the first piezoelectric material layer 614 and second piezoelectric material layer 613 stacked one over the other, the piezoelectric material m200 may output a first ultrasonic wave signal when the driving signal ds corresponds to a low-frequency signal and a second ultrasonic wave signal when the driving signal ds corresponds to a high-frequency signal. When the piezoelectric material m200 is part of the first piezoelectric material layer 614, the piezoelectric material m200 may output the first ultrasonic wave signal corresponding to the low frequency by the driving signal ds corresponding to the low-frequency signal transferred to the second element layer. When the piezoelectric material m200 is part of the second piezoelectric material layer 613, the piezoelectric material m200 may output the second ultrasonic wave signal corresponding to the high frequency by the driving signal ds corresponding to the high-frequency signal transferred to the first element layer.

In the second period Ts2, the reception circuit 802 may operate, and the ultrasonic wave signal output in the first period Ts1 may be reflected by an object. When the first ultrasonic wave signal and the second ultrasonic wave signal both are output in the first period Ts1, the first ultrasonic wave signal and the second ultrasonic wave signal both may be reflected in the second period Ts2. When the first ultrasonic wave signal is output in the first period Ts1, the first ultrasonic wave signal may be reflected in the second period Ts2 and, when the second ultrasonic wave signal is output in the first period Ts1, the second ultrasonic wave signal may be reflected in the second period Ts2.

At this time, the bias voltage GB is applied to the common electrode CE and, when the first ultrasonic wave signal or second ultrasonic wave signal is reflected, the piezoelectric material m200 may receive the reflected signal and generate a sensing signal. Thus, the piezoelectric material m200 may receive the first ultrasonic wave signal and generate the sensing signal or receive the second ultrasonic wave signal and output the sensing signal in different periods.

The reception circuit 802 may receive the sensing signal generated by a piezoelectric material layer 123 and output the sensing signal to the lead-out line ROL. The sensing signal generated by the piezoelectric material m200 and the sensing signal transferred from the reception circuit 802 to the lead-out line ROL may be differentiated as a first sensing signal ss1 and a second sensing signal ss2, respectively. The second sensing signal ss2 may be an amplified signal of the first sensing signal ss1.

Figure 11:
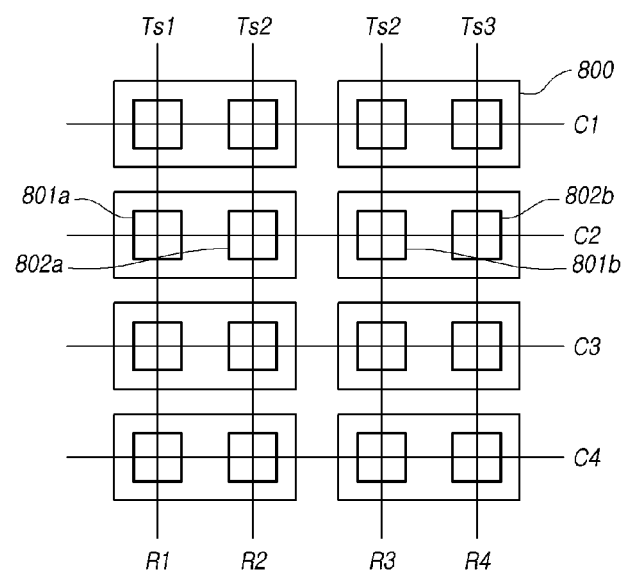
FIG. 11 is a plan view illustrating an arrangement of sensor pixels according to various embodiments of the disclosure.

FIG. 11 is a plan view illustrating an arrangement of sensor pixels according to various embodiments of the disclosure.

Referring to FIG. 11, a sensor 120 may include a plurality of sensor pixels 800 each of which includes a transmission circuit 801a or 801b and a reception circuit 802a or 802b. The transmission circuits 801a and 801b and the reception circuits 802a and 802b may be arranged in a plurality of rows C1 to C4 and a plurality of columns R1 to R4. For example, the transmission circuits 801a and 801b may be arranged in a first row R1 and a third row R3, and the reception circuits 802a and 802b may be arranged in a second row R2 and a fourth row R4. Although it is illustrated that the sensor 120 includes eight sensor pixels 800, embodiments of the disclosure are not limited thereto.

After the transmission circuits 801a arranged in the first row R1 output ultrasonic wave signals, the reception circuits 802a arranged in the second row R2 adjacent to the first row R1 may receive the reflections of the ultrasonic wave signals output from the transmission circuits 801 arranged in the first row RE When the reception circuits 802a arranged in the second row R2 receive the reflected ultrasonic wave signals, the transmission circuits 801b arranged in the third row R3 may output ultrasonic wave signals. Further, the reception circuits 802b arranged in the fourth row R4 adjacent to the third row R3 may receive the reflections of the ultrasonic wave signals output from the transmission circuits 801b arranged in the third row R3.

The transmission circuits 801a arranged in the first row R1 may be controlled to operate in the first period Ts1, and the reception circuits 802a arranged in the second row R2 and the transmission circuits 801b arranged in the third row R3 may be controlled to operate in the second period Ts2. The reception circuits 802b arranged in the fourth row R4 may be controlled to operate in a third period Ts3.

Thus, when the ultrasonic wave signals output from the transmission circuits 801a arranged in the first row R1 are reflected, the reception circuits 802a arranged in the second row R2 may receive the reflected ultrasonic wave signals and, when the ultrasonic wave signals output from the transmission circuits 801b arranged in the third row R3 are reflected, the reception circuits 802b arranged in the fourth row R4 may receive the reflected ultrasonic wave signals.

Figure 12:
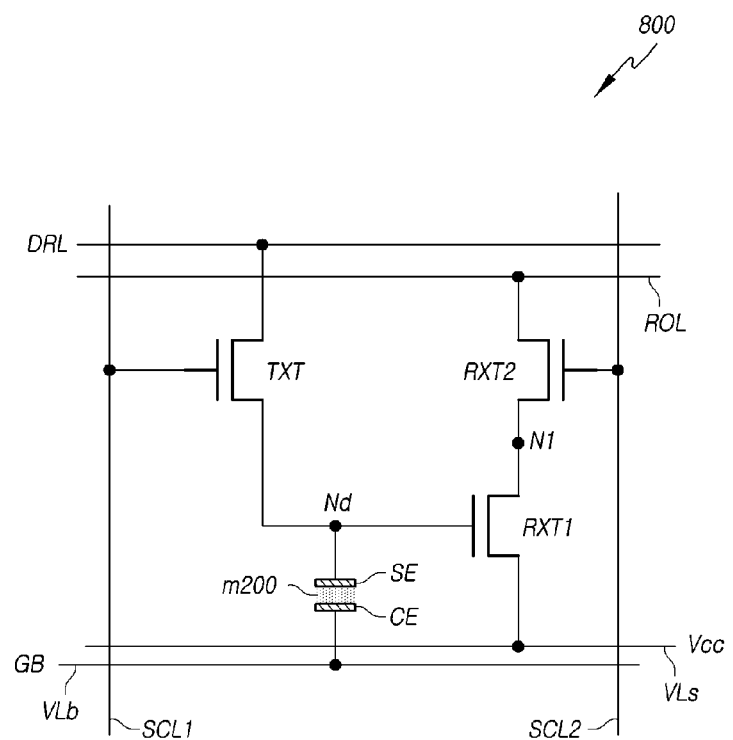
FIG. 12 is a circuit diagram illustrating a sensor pixel according to various embodiments of the disclosure.
Figure 13:
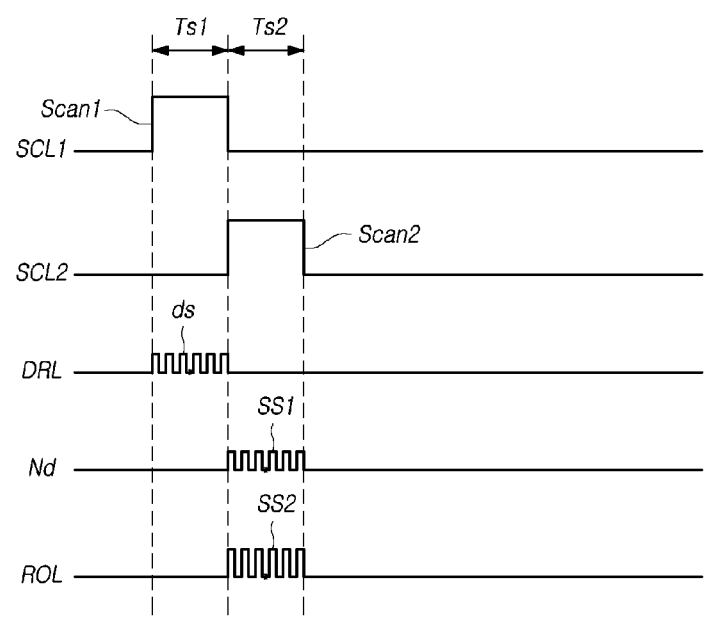
FIG. 13 is a timing diagram illustrating operations of a sensor pixel as shown in FIG. 10v according to one embodiment of the disclosure.

FIG. 12 is a circuit diagram illustrating a sensor pixel according to various embodiments of the disclosure. FIG. 13 is a timing diagram illustrating operations of a sensor pixel as shown in FIG. 12.

Referring to FIG. 12, a sensor pixel 800 may include a first transmission transistor TXT having a first electrode connected with a driving signal line DRL, a second electrode connected with a common node Nd, and a gate electrode connected with a first scan line SCL1, a first reception transistor RXT1 having a first electrode connected with a sensor power line VLs, a second electrode connected with a first node N1, and a gate electrode connected with the common node Nd, and a second reception transistor RXT2 having a first electrode connected with the first node N1, a second electrode connected with a lead-out line ROL, and a gate electrode connected with a second scan line SCL2.

A piezoelectric material m200 may correspond to a stack of a first piezoelectric material layer 614 and a second piezoelectric material layer 613. The piezoelectric material m200 may correspond to any one of the first piezoelectric material layer 614 and the second piezoelectric material layer 613. The common electrode CE may be disposed to face a first sensor pixel electrode SE or second sensor pixel electrode 710. The common electrode CE may be part of a first common electrode layer 615b or a second common electrode layer 615a.

Here, the first transmission transistor TXT may correspond to the transmission circuit 801 of FIG. 8, and the first reception transistor RXT1 and the second reception transistor RXT2 may correspond to the reception circuit 802 of FIG. 8.

Referring to FIG. 13, when a first scan signal scan1 is transferred, the first transmission transistor TXT may be turned on, and the second reception transistor RXT2 may be turned off. When the first transmission transistor TXT is turned on, a driving signal ds with a predetermined frequency may be transferred via a driving signal line DRL to the common node Nd. The driving signal ds transferred to the common node Nd may be transferred to the sensor pixel electrode SE.

The sensor pixel electrode SE may contact one surface of the piezoelectric material m200, and a common electrode line DE may be disposed on the other surface of the piezoelectric material m200. A bias voltage GB, which is a constant voltage, may be applied to the common electrode CE. Thus, the piezoelectric material layer 123 may output an ultrasonic wave signal corresponding to the driving signal ds transferred to the sensor pixel electrode SE. Since the second reception transistor RXT2 is turned off, the voltage transferred to the sensor pixel electrode SE is not transferred to the lead-out line ROL.

When a second scan signal scan2 is transferred, the first transmission transistor TXT may be turned off, and the second reception transistor RXT2 may be turned on. When the first transmission transistor TXT is turned off, the driving signal ds transferred to the driving signal line DRL is not transferred to the sensor pixel electrode SE. The bias voltage GB which is a constant voltage is applied to the common electrode CE and, when the ultrasonic wave signal is reflected, the piezoelectric material m200 may receive the reflected ultrasonic wave signal and output a sensing signal.

The sensing signal transferred from the piezoelectric material m200 to the sensor pixel electrode SE may be transferred to the gate electrode of the first reception transistor RXT1. Upon receiving the sensing signal, the first reception transistor RXT1 may repeatedly be turned on/off corresponding to the sensing signal. The sensing signal transferred from the piezoelectric material m200 to the sensor pixel electrode SE is a first sensing signal ss1. At this time, as the first electrode of the first reception transistor RXT1 is connected with the sensor power line VLs, the sensor power line VLs and the first node N1 may be repeatedly connected to and disconnected from each other by the operation of the first reception transistor RXT1. Thus, a second sensing signal ss2 may be transferred to the first node N1 by the first sensing signal ss1 and a sensor driving voltage VCC supplied to the sensor power line VLs. The second sensing signal ss2 may be an amplified signal of the first sensing signal ss1. Since the second reception transistor RXT2 remains off, the second sensing signal ss2 may be transferred to the lead-out line ROL.

Figure 14:
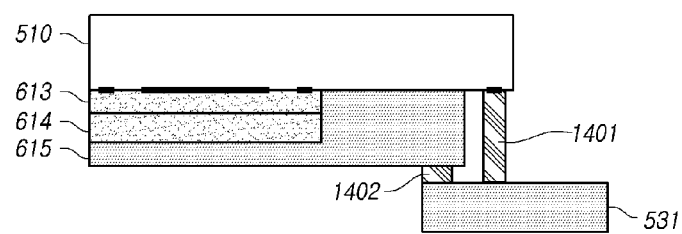
FIG. 14 is a view illustrating a connection structure between a sensor and a sensing controller in a display device according to one embodiment of the disclosure.

FIG. 14 is a view illustrating a connection structure between a sensor and a sensing controller in a display device according to one embodiment of the disclosure.

Referring to FIG. 14, the display device may further include a first wire 1401 connected to the first element layer, a second wire 1402 connected to the first common electrode layer 615, and a first sensing controller connected to the first wire 1401 and the second wire 1402.

The first element layer may be disposed on the first substrate 510. The first wire 1401 may be connected with the first element layer disposed on the first substrate 510. The first common electrode layer 615 may be disposed under the first substrate 510 where the first piezoelectric material layer 614 and the second piezoelectric material layer 613 are stacked one over the other. The first common electrode layer 615 may partially contact the first substrate 510. The second wire 1402 may be connected with the first common electrode layer 615.

The first wire 1401 and the second wire 1402 each may be a flexible printed circuit cable. The first wire 1401 and the second wire 1402 may be connected to a printed circuit board 531. The first sensing controller (not shown) may be disposed on the printed circuit board 531.

Figure 15:
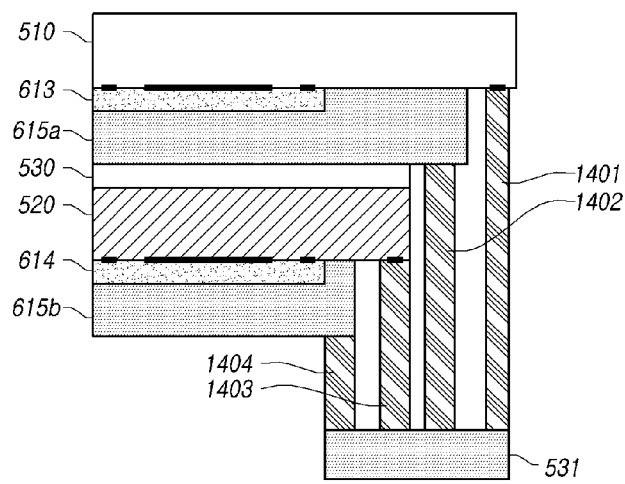
FIG. 15 is a view illustrating a connection structure between a sensor and a sensing controller in a display device according to one embodiment of the disclosure.

FIG. 15 is a view illustrating a connection structure between a sensor and a sensing controller in a display device according to one embodiment of the disclosure.

Referring to FIG. 15, the display device 100 may further include a first wire 1401 connected to the first element layer, a second wire 1402 connected to the second common electrode layer 615a, a third wire 1403 connected to the second element layer, a fourth wire 1404 connected to the first common electrode layer 615b, and a first sensing controller (not shown) connected with the first to fourth wires 1404.

The first element layer may be disposed on the first substrate 510. The first wire 1401 may be connected with the first element layer disposed on the first substrate 510. A second common electrode layer 615a may be disposed under the first substrate 510 where the second piezoelectric material layer 613 is disposed. The second common electrode layer 532 may partially contact the first substrate 510. The second wire 1402 may be connected with the second common electrode layer 615a.

The second substrate 520 may be fastened to the second common electrode layer 532 via a second adhesive layer 530. The second element layer may be disposed on the second substrate 520. The third wire 1403 may be connected to the second substrate 520 where the second element layer is disposed. The second substrate 520 may be smaller in size than the first substrate 510. The first common electrode layer 615b may be disposed under the second substrate 520 where the first piezoelectric material layer 614 is disposed. The first common electrode layer 615b may partially contact the second substrate 520. The first common electrode layer 615b may be smaller in size than the second common electrode layer 615a. The fourth wire 1404 may be connected to the first common electrode layer 615b.

The first wire 1401 to the fourth wire 1404 each may be a flexible printed circuit cable. The first wire 1401 to the fourth wire 1404 may be connected to a printed circuit board 531. The first sensing controller (not shown) may be disposed on the printed circuit board 531.

Figure 16:
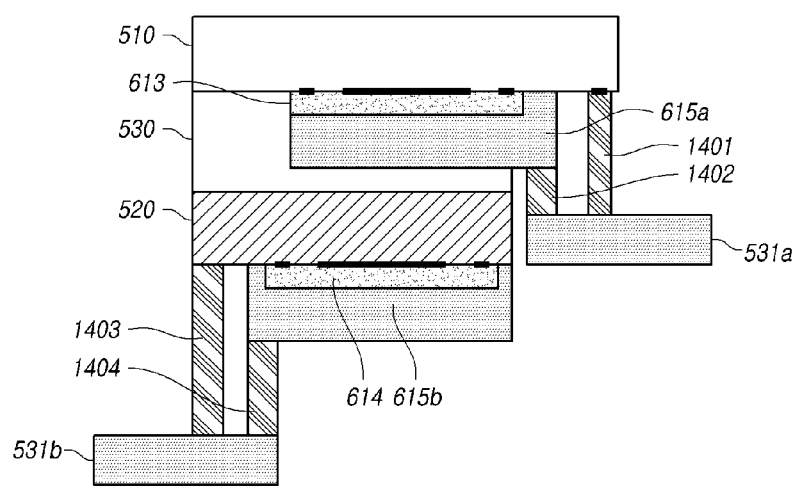
FIG. 16 is a view illustrating a connection structure between a sensor and a sensing controller in a display device according to one embodiment of the disclosure.

FIG. 16 is a view illustrating a connection structure between a sensor and a sensing controller in a display device according to one embodiment of the disclosure.

Referring to FIG. 16, the display device 100 may further include a first wire 1401 connected to the first element layer, a second wire 1402 connected to the second common electrode layer 615a, a first sensing controller (not shown) connected with the first wire 1401 and the second wire 1402, a third wire 1403 connected to the second element layer, a fourth wire 1404 connected to the first common electrode layer 615b, and a second sensing controller (not shown) connected with the third wire 1403 and the fourth wire 1404.

The first element layer may be disposed on the first substrate 510. The first wire 1401 may be connected with the first element layer disposed on the first substrate 510. A second common electrode layer 615a may be disposed under the first substrate 510 where the second piezoelectric material layer 613 is disposed. The second common electrode layer 615a may partially contact the first substrate 510. The second wire 1402 may be connected with the second common electrode layer 615a. The first wire 1401 and the second wire 1402 may be flexible printed circuit cables. The first wire 1401 and the second wire 1402 may be connected to a first printed circuit board 531. The first sensing controller may be disposed on the first printed circuit board 531a.

The second substrate 520 may be fastened to the second common electrode layer 615a via a second adhesive layer 530. The second adhesive layer 530 may cover the bottom and side surface of the second common electrode layer 615a. The second element layer may be disposed on the second substrate 520. The second substrate 520 may be smaller in size than the first substrate 510. The first common electrode layer 615b may be smaller in size than the second common electrode layer 615a. The first common electrode layer 615b may be disposed under the second substrate 520 where the first piezoelectric material layer 614 is disposed. The first common electrode layer 615b may partially contact the second substrate 520. The fourth wire 1404 may be connected to the first common electrode layer 615b.

The third wire 1403 and the fourth wire 1404 may be flexible printed circuit cables. The third wire 1403 and the fourth wire 1404 may be connected to a second printed circuit board 531b. The second sensing controller may be disposed on the second printed circuit board 531b.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device, comprising:
   a display panel; and
   a sensor including:
      a first piezoelectric material layer;
      a second piezoelectric material layer disposed under the first piezoelectric material layer to overlap the first piezoelectric material layer;
      a first common electrode disposed on the first piezoelectric material layer;
      a first sensor pixel electrode disposed under the second piezoelectric material layer; and a first element layer disposed under the first sensor pixel electrode and connected with the first sensor pixel electrode.

2. The display device of claim 1, further comprising:
a second common electrode disposed on the second piezoelectric material layer between the first piezoelectric material layer and the second piezoelectric material layer;
a second sensor pixel electrode disposed under the second piezoelectric material layer; and
a second element layer disposed under the second sensor pixel electrode and connected with the second sensor pixel electrode.

3. The display device of claim 1, wherein the first element layer includes a plurality of first sensor pixels, each of the plurality of first sensor pixels including a first transmission circuit transferring a first driving signal to the first sensor pixel electrode and a first reception circuit receiving a sensing signal from the first sensor pixel electrode.

4. The display device of claim 3, wherein the first transmission circuit receives the first driving signal from a first driving signal line and transfers the first driving signal to the first sensor pixel electrode during each of a plurality of driving periods that sequentially occur, and
the first reception circuit receives the sensing signal from the first sensor pixel electrode and transfers the sensing signal to a first lead-out line during each of a plurality of sensing periods that sequentially occur.

5. The display device of claim 3, wherein first transmission circuits are arranged in a first row of the plurality of first sensor pixels, and first reception circuits are arranged in a second row, adjacent to the first row, of the plurality of first sensor pixels.

6. The display device of claim 5, wherein after a first scan signal is transferred to the first transmission circuits, a second scan signal is transferred to the first reception circuits.

7. The display device of claim 3, wherein the first transmission circuit includes a first transmission transistor disposed between the first driving signal line and the first sensor pixel electrode and turned on corresponding to a first scan signal, and
the first reception circuit includes a first reception transistor disposed between a first sensor power line and a first node and turned on corresponding to a voltage to the first sensor pixel electrode and a second reception transistor disposed between a first lead-out line and the first reception transistor and turned on corresponding to a second scan signal.

8. The display device of claim 4, wherein the plurality of driving periods include a first driving signal during which the first driving signal is output as a low-frequency signal and a second driving period during which the first driving signal is output as a high-frequency signal.

9. The display device of claim 2, wherein the second element layer includes a plurality of second sensor pixels, each of the plurality of second sensor pixels including a second transmission circuit transmitting a second driving signal to the second sensor pixel electrode and a second reception circuit receiving a second sensing signal from the second sensor pixel electrode.

10. The display device of claim 9, wherein the second transmission circuit receives the second driving signal from a second driving signal line and transfers the second driving signal to the second sensor pixel electrode during each of a plurality of driving periods that sequentially occur, and
the second reception circuit receives the second sensing signal from the second sensor pixel electrode and transfers the second sensing signal to a second lead-out line during each of a plurality of sensing periods that sequentially occur.

11. The display device of claim 9, wherein second transmission circuits are arranged in a first row of the plurality of second sensor pixels, and second reception circuits are arranged in a second row, adjacent to the first row, of the plurality of second sensor pixels.

12. The display device of claim 11, wherein after a third scan signal is transferred to the second transmission circuits, a fourth scan signal is transferred to the second reception circuits.

13. The display device of claim 10, wherein the second transmission circuit includes a second transmission transistor disposed between the second driving signal line and the second sensor pixel electrode and turned on corresponding to a third scan signal, and
the second reception circuit includes a third reception transistor disposed between a second sensor power line and a second node and turned on corresponding to a voltage to the second sensor pixel electrode and a fourth reception transistor disposed between a second lead-out line and the third reception transistor and turned on corresponding to a second scan signal.

14. The display device of claim 10, wherein during the plurality of driving periods, the first driving signal is output as a low-frequency signal, and the second driving signal is output as a high-frequency signal.

15. The display device of claim 1, further comprising:
a first wire connected to the first element layer;
a second wire connected to the first common electrode; and
a first sensing controller connected to the first wire and the second wire.

16. The display device of claim 2, further comprising:
a first wire connected to the first element layer;
a second wire connected to the second common electrode;
a third wire connected to the second element layer;
a fourth wire connected to the first common electrode; and
a first sensing controller connected to the first to fourth wires.

17. The display device of claim 2, further comprising:
a first wire connected to the first element layer;
a second wire connected to the second common electrode;
a first sensing controller connected with the first wire and the second wire;
a third wire connected to the second element layer;
a fourth wire connected to the first common electrode; and
a second sensing controller connected with the third wire and the fourth wire.

18. The display device of claim 1, wherein the first piezoelectric material layer generates a signal with a lower frequency than a frequency of a signal generated by the second piezoelectric material layer.

19. The display device of claim 1, further comprising:
a first adhesive layer disposed on the first common electrode;
a film layer disposed on the first adhesive layer; and
a protection film disposed on the film layer.

* * * * *